June 4, 1957 D. M. BLACK ET AL 2,794,865

AMPLIFIERS HAVING MISMATCHED INTERSTAGE NETWORKS

Filed Sept. 8, 1953 3 Sheets-Sheet 1

INVENTORS D. M. BLACK
H. H. HOFFMAN
BY Hugh S. Wertz
ATTORNEY

INVENTORS D. M. BLACK
H. H. HOFFMAN
BY
Hugh S. Wertz
ATTORNEY

AMPLIFIERS HAVING MISMATCHED INTERSTAGE NETWORKS

Filed Sept. 8, 1953 3 Sheets-Sheet 3

INVENTORS D. M. BLACK
H. H. HOFFMAN
BY
Hugh S. Wertz
ATTORNEY

United States Patent Office 2,794,865

Patented June 4, 1957

2,794,865

AMPLIFIERS HAVING MISMATCHED INTERSTAGE NETWORKS

Donald M. Black, Glen Ridge, and Harold H. Hoffman, Plainfield, N. J., assignors to Bell Telephone Laboratories, Incorporated, New York, N. Y., a corporation of New York Application September 8, 1953, Serial No. 378,743

3 Claims. (Cl. 179—171)

Figure 1:
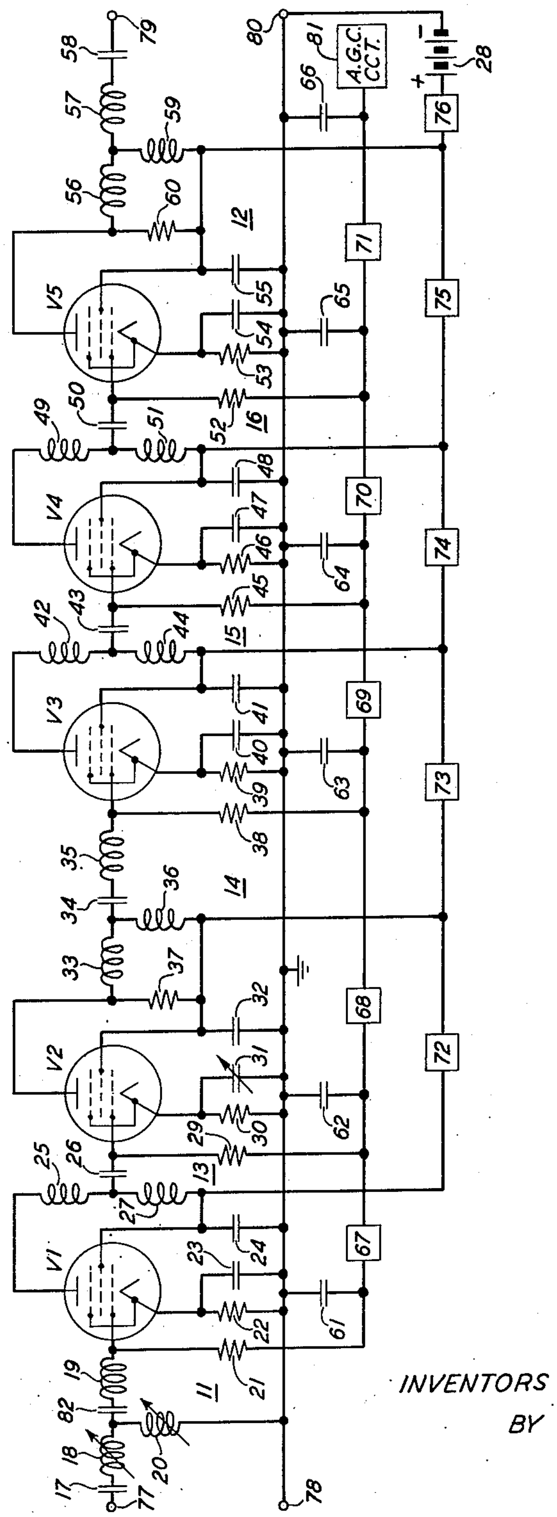

This invention relates to amplifiers and particularly to amplifiers having mismatched interstage networks.

An object of the invention is to provide an improved high gain amplifier having a stable gain-frequency characteristic over a broad band of frequencies and over a wide range of amplifier gain.

It has been observed that when properly tuned mismatched networks are used as interstage circuits in an amplifier, a substantial increase in gain is observed over amplifiers using the more common matched interstage networks. The mismatched networks hereinafter referred to are parallel tuned transformers, or their equivalent, with the damping or loading resistor omitted on either the input or output side thereof.

While amplifiers using mismatched interstages have been shown to have greatly improved gain characteristics, it also has been observed that the mismatched networks are sensitive to capacitance changes taking place in the amplifier so that small changes in capacitance, such as, for example, grid-cathode capacitance of gain controlled amplifier tubes, causes the amount of gain for each interstage to change radically with frequency. Hence, while the high gain characteristic of the amplifiers is most desirable, heretofore such amplifiers, particularly gain controlled amplifiers, have been limited to applications that require stable gain characteristics over only a narrow frequency band.

A specific object of this invention is to widen the frequency range of amplifiers employing mismatched networks over which range the gain-frequency characteristic remains stable.

An additional object of the invention is to widen the range of amplifier gain over which the broad band gain-frequency characteristic remains stable.

It has been discovered that increasing the capacitance on the damped side or decreasing it on the undamped side of a mismatched interstage network results in increasing gain with frequency. Likewise, decreasing the capacitance on the damped side or increasing it on the undamped side causes the gain to decrease with frequency. In circuit applications where capacitance changes occur in an element associated with either the input or the output side of the network, the type of gain-frequency response curve desired may be effected by selectively damping the network either on the side adjacent to or the side remote from the element having changing capacitance characteristics. It is this understanding which is utilized in accordance with the invention to produce a broad band high gain amplifier.

The invention contemplates a multiple stage gain controlled amplifier wherein the capacitance of at least one of the elements of each stage is caused to change with changes in gain control. The stages are joined by mismatched interstage networks and each network is selectively damped on either the side remote from or adjacent to the variable capacitance element in the amplification stage. By selective damping, the gain-frequency response characteristics for the various interstages are made to be substantially complementary so that the total gain of the amplifier, which is the sum of the gain of the individual stages and interstages, is stable over a broad frequency band.

One important advantage of this arrangement is that not only does the amplifier have a high gain characteristic because of the mismatched interstage networks, but due to the use of an automatic gain control circuit and the selective damping of the mismatched networks the amplifier has a stable gain characteristic over a broad band of frequencies.

Another important advantage is that the amplifier has a stable broad band gain-frequency characteristic over a wide range of amplifier gain.

Figure 6:
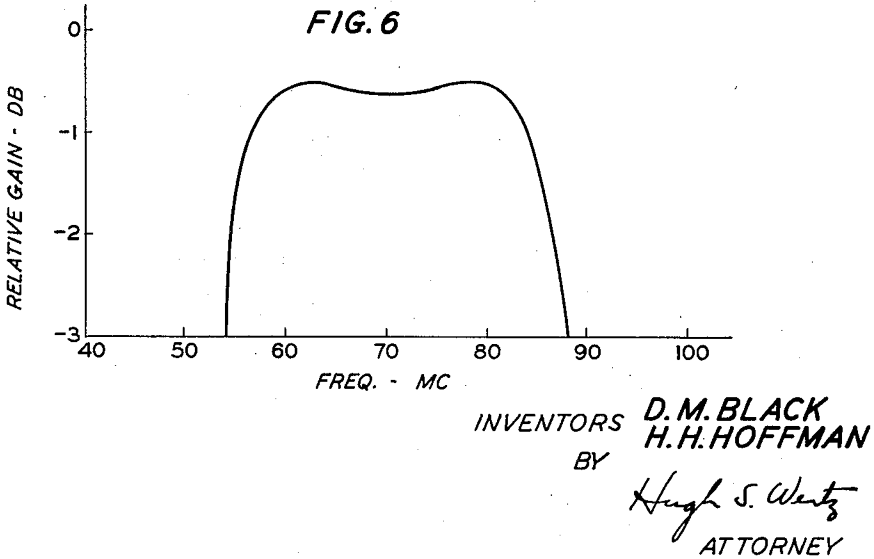

The invention, its objects and advantages, will be better understood by referring to the following disclosure and drawings forming a part thereof wherein:

Fig. 1 is a circuit diagram in schematic form of an amplifier in accordance with the invention;

Figs, 2, 3, 4 and 5 show approximate gain-frequency responsive curves of mismatched networks for different capacitance changes on the damped and undamped sides thereof; and Fig. 6 shows a typical gain-frequency response curve for an amplifier as shown in Fig. 1.

Referring particularly to Fig. 1, there is shown one embodiment of the invention, given by way of example for purposes of illustration, comprising an amplifier which includes the intermediate frequency amplifier tubes $V_1$, $V_2$, $V_3$, $V_4$ and $V_5$. A signal source is coupled at input terminals 77 and 78 to tube $V_1$ through a tuned circuit 11 and a load at output terminals 79 and 80 is coupled to tube $V_5$ through tuned circuit 12. These circuits are the equivalents of parallel-to-parallel double tuned circuits and are of the matched type in order to secure optimum input and output impedance matching. The amplifier tubes are joined in cascade by interstage networks 13, 14, 15 and 16 respectively, which are the T equivalents of parallel-to-parallel double tuned circuits and are of the mismatched type to realize maximum gain.

In order to maintain the amplifier output substantially constant, a simple type of gain control is provided comprising a grid bias control circuit which is controlled by feedback from an automatic gain control circuit 81. This monitor circuit may be one of a type shown in Fig. 13, page 641 of Terman's Radio Engineers' Handbook, 1943. In the amplification stages of Fig. 1, changes in the grid bias of the amplifier tubes cause corresponding grid-cathode capacitance changes which influence the gain-frequency response characteristics of the interstage networks. To effect an amplifier having a substantially flat gain-frequency response curve in spite of the distortion introduced because of capacitance changes, one of the mismatched interstage networks, in this case network 14, is damped on its input side and the remaining interstage networks are damped on their output sides.

Input signals are fed into the circuit from terminal 77 through a coupling capacitor 17 and inductance 18 which comprises one arm of circuit 11 and capacitor 82 and inductor 19 which comprise a second arm of circuit 11 to the control grid of tube $V_1$. The junction of inductor 18 and capacitor 82 is connected to ground potential through an inductance 20 which forms the third branch arm of circuit 11. A loading resistor 21, which is the damping element for circuit 11, is connected from the control grid of $V_1$ to the grid bias control circuit. The cathode of $V_1$ is connected to the suppressor grid and through the parallel connected resistor 22 and bypass capacitor 23 to ground. The screen grid is connected to ground through bypass capacitor 24. The output from the anode of $V_1$ is fed through inductor 25 and capactior 26, which form a part of the interstage network 13, to the control grid of tube $V_2$, and inductor 27, which forms a part of network 13, is connected between the junction of inductor 25 and capacitor 26 to capacitor 24 and to the positive terminal of source 28. A damping resistor 29 of the network 13 is connected between the control grid of $V_2$ and the grid bias control circuit. The cathode of $V_2$ is connected to the suppressor grid and through parallel connected resistor 30 and the partial bypass capacitor 31 to ground. The partial bypass capacitor 31 is not of sufficiently high a value to completely bypass the A.-C. current to ground. As a result the capacitor can be made to series resonate with the inductance of the cathode lead. Capacitor 31 is made adjustable so that its value may be properly set for the given operating conditions for reasons which will be explained more fully hereinafter. The screen grid of $V_2$ is connected to ground potential through bypass capacitor 32. The anode of tube $V_2$ is connected to the control grid of $V_3$ through inductor 33, capacitor 34, and inductor 35 which form a part of the interstage network 14. The junction of inductor 33 and capacitor 34 is connected to the positive terminal of source 28 and to capacitor 32 through inductor 36. Inductor 33 is also connected to capacitor 32 by a load resistor 37 which is the damping element of network 14. A small grid resistor 38 connects the control grid of $V_3$ to the grid bias control circuit. The cathode of $V_3$ is connected to the suppressor grid and also to ground through a resistor 39 and capacitor 40 in an arrangement similar to that of tube $V_1$. The screen grid is connected by a capacitor 41 to ground as in tubes $V_1$ and $V_2$. Interstage network 15 which feeds the output of the anode of $V_3$ to the control grid of $V_4$ and which includes inductor 42, capacitor 43, inductor 44 and resistor 45 is similar in structure and interstage connection to that of the interstage network 13. In addition, the cathode connection of $V_4$ including resistor 46 and capacitor 47 and the screen grid connection including capacitor 48 are similar to those connections of tube $V_3$. The interstage network 16 connecting tubes $V_4$ and $V_5$, which includes inductor 49, capacitor 50, inductor 51 and resistor 52, is similar to interstage network 15 which connects tubes $V_3$ and $V_4$ and the interstage connections between tubes $V_4$ and $V_5$ are made in a similar manner. The cathode connection of $V_5$ to ground including a resistor and capacitor 53 and 54, respectively, and the screen grid connection to ground including capacitor 55 are similar to the cathode and screen grid connections of tube $V_3$ and tube $V_4$.

Connected to the anode of $V_5$ is the output circuit 12 referred to above. The output from the anode of $V_5$ is applied to the output terminal 79, through inductors 56 and 57 and capacitor 58 all connected in series. The junction of inductors 56 and 57 is connected to capacitor 55 and to the positive terminal of the source 28 through the inductor 59. A resistor 60 also joins inductor 56 to capacitor 55.

To eliminate current fluctuations in the grid control circuit there is included therein filter networks comprising parallel connected bypass capacitors to ground and series connected impedance damping units. The bypass capacitors 61, 62, 63, 64 and 65, respectively, connect the grid control circuit to ground at each grid connection and at the output terminals; the impedance damping units 67, 68, 69, 70 and 71, respectively, each comprising a parallel connected inductor and resistor are placed in the line between each pair of capacitor connections. These filter circuits and the impedance damping units thereof may be of any type well known in the art and are, for example, of the type shown in the I. F. gain network of the circuit in Fig. 7, page 1212, Proceedings of the Institute of Radio Engineers, volume 35, November 1947. To dampen fluctuations in the constant potential source line, series impedance units 72, 73, 74, 75 and 76 are connected in the line between the connections to the interstage networks and between the output coupling network connection and source 28. These impedance units are similar to those found in the grid bias control circuit.

Figure 2:
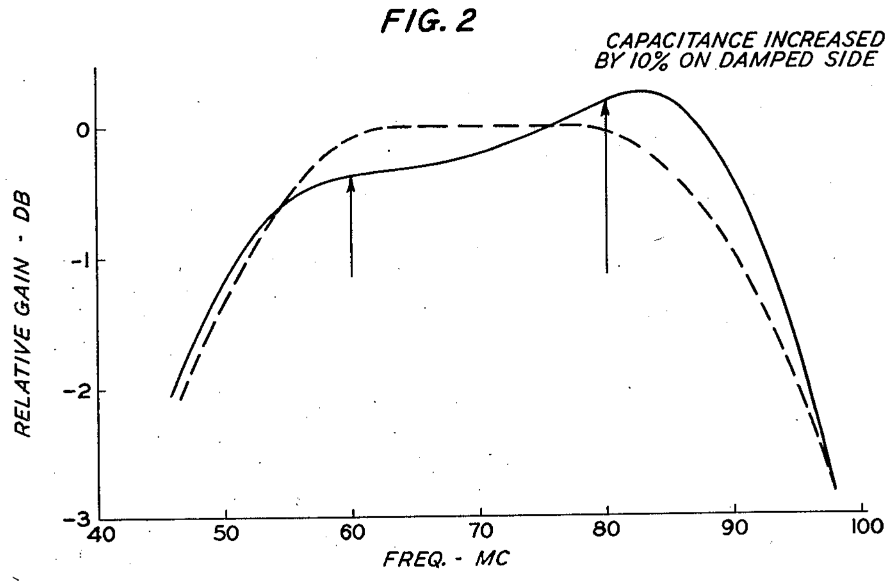
Figure 3:
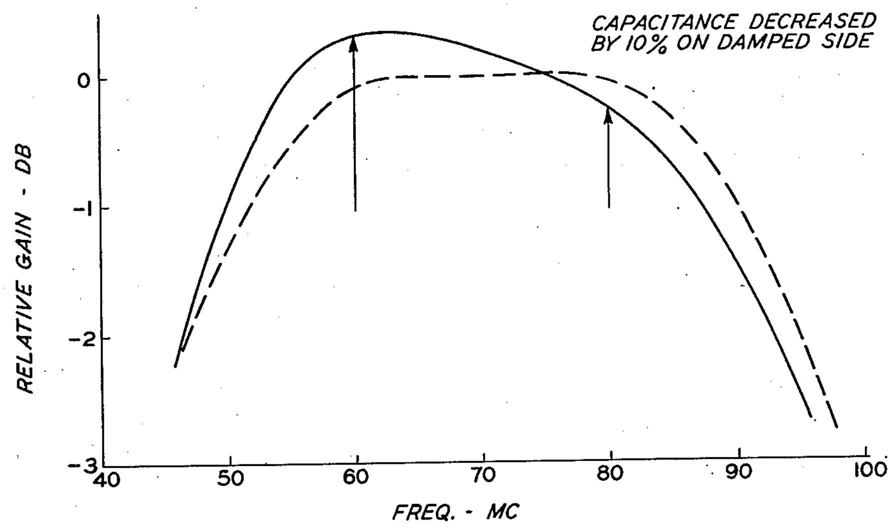
Figure 4:
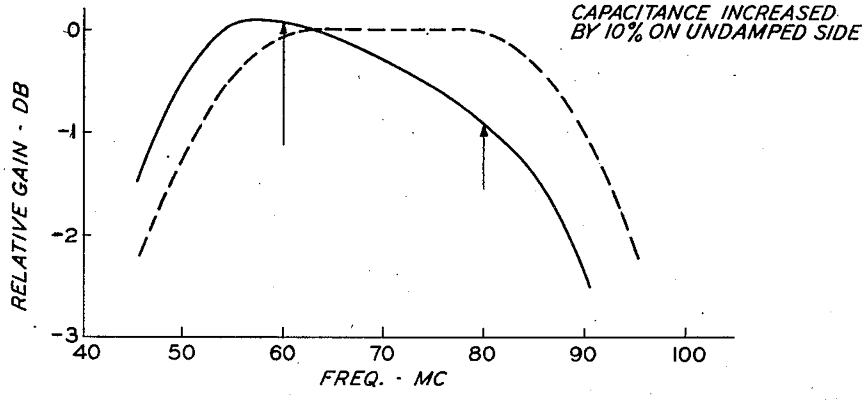
Figure 5:
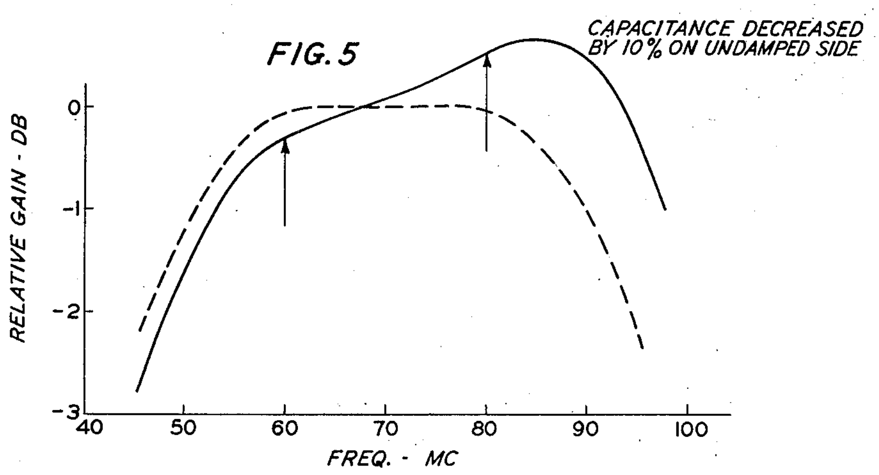

As pointed out above, the amplifier output is maintained substantially constant by an automatic gain control circuit of the type described. The output is held constant by controlling the grid bias voltage in each amplifier tube in response to voltage fluctuations observed in the output circuit. However, with each variation in grid bias voltage the grid-cathode capacitance of each tube is changed, which change is reflected in the input and interstage coupling networks of the system. As pointed out above, these changes in capacitance cause radical changes in the gain-frequency response curves of the mismatched interstage coupling networks. In addition, it has been found that the change in the gain-frequency response curve is directly influenced by whether the change in capacitance is on the input or output side of the network, and by whether the capacitance is an increase or decrease over the initial capacitance condition. By way of example, Figs. 2, 3, 4 and 5 show the characteristic effect on the frequency response curves that have been observed for increases and decreases in capacitance occurring on the damped and undamped sides of mismatched networks. In each of these figures the dashed lines represent the gain response curve for a network tuned to give substantially flat gain-frequency response characteristics over a frequency band of 60 to 80 megacycles and the solid line represents the distorted gain curve caused by the changes in capacitance. Fig. 2 shows that an increase of ten percent in capacitance on the damped side will distort the gain curve so that at the upper band frequency the gain is substantially 0.6 decibel greater than that at the lower band frequency. Fig. 3 shows that when the capacitance is decreased by ten percent on the damped side, the gain at the upper band frequency is substantially 0.6 decibel less than that at the lower band frequency. For an increase in capacitance to ten percent on the undamped side of the network, Fig. 4 shows that the gain at the upper band frequency is substantially 1.0 decibel less than that at the lower band frequency. Fig. 5 shows that for a decrease in capacitance of ten percent on the undamped side the gain at the upper band frequency is substantially 1.0 decibel greater than at the lower band frequency. While the effect illustrated is shown for a particular frequency band and for particular changes in capacitance, it is understood that the figures characterize the changes that take place in the gain-frequency response curves over other frequency bands and for other values of capacitance changes.

It is readily observable from the curves that increasing the capacitance on the damped side or decreasing it on the undamped side, results in increasing gain with frequency, and decreasing the capacitance on the undamped side or increasing it on the damped side, results in decreasing gain with frequency. It may be further noted that the gain-frequency distortions are more severe with capacitance changes on the undamped side of the mismatched networks than for capacitance changes on the damped side of the networks.

In the amplifier circuit of Fig. 1 the capacitance changes caused by the gain control system are effectively observable only at the grid of each amplifier tube. The change in capacitance in each instance is applied to the grid or output side of the connected coupling circuits, and of these circuits the gain characteristics of only the mismatched interstage circuits are affected substantially thereby. The gain distortion resulting in each interstage network from effective capacitance changes can be balanced by selectively damping some of the interstage networks on the output or grid side and others on the input or anode side. In practice, it has been found that five amplification stages coupled to an input and an output by matched networks and joined in cascade by four interstage networks, three interstages of which are damped on the grid side and one interstage of which is damped on the anode side, will operate so as to give a high gain amplifier having a gain characteristic that is stable over a broad frequency band and independent of grid capacitance changes.

To further stabilize the gain-frequency response curve, the cathode resistor 30 of tube $V_2$ has been partially bypassed by condenser 31 as was explained in the foregoing. It has been found that when a small capacitor such as capacitor 31 is of proper value, it series resonates with the cathode lead inductance, which in turn alters the input capacitance of the tube. In the amplifier of the present invention, such an arrangement is advantageously used to completely balance the amplifier. For example, the matched input and output stages do not give an absolutely flat gain-frequency response, and their effect will, in most cases, add to the effect of the mismatched stage which is damped on the input side of the coupling. Ordinarily the automatic gain control effects a capacitance change in all stages equally so that the three mismatched stages which are damped on the output side have a total effect on the gain-frequency response which is slightly different from the effect of the two matched stages and the single mismatched stage damped on the input side of the coupling. Capacitor 31 has the effect of decreasing the capacitor change in the one stage with which it is associated, thereby making it possible to achieve a complete balance. For obvious reasons, capacitor 31 is made adjustable to permit the achievement of this balance. The balanced and equalized output of the amplifier is shown in a typical gain-frequency response curve of Fig. 5.

While there are any number of possible values suitable for use in the circuit elements, by way of example, the values used in an operable embodiment of the amplifier of Fig. 1 (for an amplifier having a stable gain-frequency characteristic over a range of amplifier gain from substantially 25 to 67 decibles and a 20 megacycle frequency band centered at 70 megacycles) are:

| | | |
|---|---|---|
| $V_1$ | 404A (Western Electric) | |
| $V_2$ | 404A (Western Electric) | |
| $V_3$ | 404A (Western Electric) | |
| $V_4$ | 404A (Western Electric) | |
| $V_5$ | 404A (Western Electric) | |
| 17 | micromicrofarads | 18 |
| 18 | microhenries | .14 |
| 19 | do | .241 |
| 20 | do | .204 |
| 21 | ohms | 360 |
| 22 | do | 110 |
| 23 | micromicrofarads | 1500 |
| 24 | do | 1500 |
| 25 | microhenries | .890 |
| 26 | micromicrofarads | 680 |
| 27 | microhenries | .424 |
| 28 | volts | 150 |
| 29 | ohms | 200 |
| 30 | do | 110 |
| 31 | micromicrofarads | 230 |
| 32 | do | 1500 |
| 33 | microhenries | .46 |
| 34 | micromicrofarads | 1000 |
| 35 | microhenries | .045 |
| 36 | do | .322 |
| 37 | ohms | 470 |
| 38 | do | 50,000 |
| 39 | do | 110 |
| 40 | micromicrofarads | 1500 |
| 41 | do | 1500 |
| 42 | microhenries | 1.06 |
| 43 | micromicrofarads | 680 |
| 44 | microhenries | .468 |
| 45 | ohms | 200 |
| 46 | do | 110 |
| 47 | micromicrofarads | 1500 |
| 48 | do | 1500 |
| 49 | microhenries | .86 |
| 50 | micromicrofarads | 680 |
| 51 | microhenries | .527 |
| 52 | ohms | 200 |
| 53 | do | 110 |
| 54 | micromicrofarads | 1500 |
| 55 | do | 1500 |
| 56 | microhenries | .673 |
| 57 | do | .063 |
| 58 | micromicrofarads | 18 |
| 59 | microhenries | .259 |
| 60 | ohms | 1000 |
| 61 | micromicrofarads | 1500 |
| 62 | do | 1500 |
| 63 | do | 1500 |
| 64 | do | 1500 |
| 65 | do | 1500 |
| 66 | do | 1500 |
| 82 | do | 1000 |

It is understood that the above-described arrangement is merely illustrative of the application of the principles of the invention and numerous other arrangements might be devised by those skilled in the art without departing from the spirit and scope of the invention.

What is claimed is:

1. An amplifier comprising a plurality of stages, each stage comprising an electron discharge device having an anode, a cathode, and a control grid, means connected to said control grid of each stage for providing gain control, a tuned matched input circuit connected to the first stage of said amplifier, a tuned matched output circuit connected to the final stage of said amplifier, three or more double-tuned selectively damped interstage networks for connecting the stages in cascade between the anode of one of said devices and the control grid of another of said devices, one of said networks being damped at the anode connection and the other ones of said networks being damped at the control grid connection whereby each of said networks is substantially mismatched over the entire range of amplification, and means for altering the gain-frequency response of one of the stages having its input connected to an interstage network damped at the control grid connection whereby the amplifier has a stable gain-frequency response characteristic over a broad band of frequencies.

2. An amplifier according to claim 1 wherein the means for altering the gain-frequency response of said one of said stages comprises an adjustable bypass capacitor in the cathode circuit of said stage.

3. A wide band gain controlled amplifier comprising a plurality of amplification stages, means for providing gain control for said stages, and three or more interstage coupling means for connecting said stages in cascade, each of said interstage coupling means comprising a double tuned inductive network having a tuned primary side and a tuned secondary side, a damping means connected in shunt with the input side of one of said inductive networks and damping means connected in shunt with the output side of each of the other ones of said inductive networks, whereby each of said networks is substantially mismatched over the entire range of amplification to provide gain-frequency response characteristics for said amplification stages that are substantially complementary, and means for providing a substantially stable gain-frequency characteristic of said amplifier over a broad frequency band including means connected to one of said stages for altering the gain control effect on said one stage.

References Cited in the file of this patent

UNITED STATES PATENTS

| | | |
|---|---|---|
| 2,185,879 | Allen | Jan. 2, 1940 |
| 2,261,803 | Grundmann | Nov. 4, 1941 |
| 2,404,270 | Bradley | July 16, 1946 |
| 2,626,323 | Sziklai | Jan. 20, 1953 |
| 2,710,314 | Tongue et al. | June 7, 1955 |
| 2,721,260 | Schmidt | Oct. 18, 1955 |